(12) United States Patent
Kruijt-Stegeman et al.

(10) Patent No.: US 10,712,678 B2
(45) Date of Patent: Jul. 14, 2020

(54) IMPRINT LITHOGRAPHY APPARATUS AND METHOD

(71) Applicant: ASML NETHERLANDS B.V., Veldhoven (NL)

(72) Inventors: Yvonne Wendela Kruijt-Stegeman, Eindhoven (NL); Andre Bernardus Jeunink, Bergeijk (NL); Arie Jeffrey Den Boef, Waalre (NL); Vadim Yevgenyevich Banine, Deurne (NL); Michael Jozef Mathijs Renkens, Sittard (NL); Gerard Van Schothorst, Waardenburg (NL); Johan Frederik Dijksman, Weert (NL); Carolus Johannes Catharina Schoormans, Hooge Mierde (NL); Adrianus Hendrik Koevoets, Mierlo (NL); Catharinus De Schiffart, Nijmegen (NL); Sander Frederik Wuister, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 572 days.

(21) Appl. No.: 15/046,284

(22) Filed: Feb. 17, 2016

(65) Prior Publication Data
US 2016/0195823 A1 Jul. 7, 2016

Related U.S. Application Data

(63) Continuation of application No. 12/820,492, filed on Jun. 22, 2010.
(Continued)

(51) Int. Cl.
*B29C 43/58* (2006.01)
*G03F 9/00* (2006.01)
(Continued)

(52) U.S. Cl.
CPC .......... *G03F 9/7042* (2013.01); *B29C 43/021* (2013.01); *B29C 59/022* (2013.01);
(Continued)

(58) Field of Classification Search
USPC ................................ 425/150; 264/40.1, 40.5
See application file for complete search history.

(56) References Cited

U.S. PATENT DOCUMENTS

| 4,731,155 A | 3/1988 | Napoli et al. |
| 4,861,162 A | 8/1989 | Ina |

(Continued)

FOREIGN PATENT DOCUMENTS

| EP | 1832933 | 9/2007 |
| JP | 2006-203183 | 8/2006 |

(Continued)

OTHER PUBLICATIONS

U.S. Office Action dated Mar. 22, 2016 in corresponding U.S. Appl. No. 12/820,492.

(Continued)

*Primary Examiner* — Atul P. Khare
(74) *Attorney, Agent, or Firm* — Pillsbury Winthrop Shaw Pittman LLP

(57) ABSTRACT

An imprint lithography apparatus is disclosed that includes an imprint template holder arranged to hold an imprint template, and a plurality of position sensors configured to measure change of the size and/or shape of the imprint template, wherein the position sensors are mechanically isolated from the imprint template. Also disclosed is a lithography method that includes using an imprint template to imprint a pattern onto a substrate, and measuring changes of the size and/or shape of the imprint template while imprinting the pattern onto the substrate.

9 Claims, 7 Drawing Sheets

Related U.S. Application Data

(60) Provisional application No. 61/307,610, filed on Feb. 24, 2010, provisional application No. 61/213,700, filed on Jul. 6, 2009.

(51) Int. Cl.
*B82Y 10/00* (2011.01)
*B82Y 40/00* (2011.01)
*G03F 7/00* (2006.01)
*G03F 7/20* (2006.01)
*B29C 43/02* (2006.01)
*B29C 59/02* (2006.01)
*B29C 59/16* (2006.01)

(52) U.S. Cl.
CPC .............. *B82Y 10/00* (2013.01); *B82Y 40/00* (2013.01); *G03F 7/0002* (2013.01); *G03F 7/70775* (2013.01); *B29C 2043/025* (2013.01); *B29C 2043/5833* (2013.01); *B29C 2043/5891* (2013.01); *B29C 2059/023* (2013.01)

(56) References Cited

U.S. PATENT DOCUMENTS

| | | | |
|---|---|---|---|
| 5,772,905 A | 6/1998 | Chou | |
| 6,208,407 B1 | 3/2001 | Loopstra | |
| 6,334,960 B1 | 1/2002 | Wilson et al. | |
| 6,525,829 B1 | 2/2003 | Powell et al. | |
| 6,847,433 B2 | 1/2005 | White et al. | |
| 6,900,881 B2 | 5/2005 | Sreenivasan et al. | |
| 6,909,998 B2 | 6/2005 | Hocheng et al. | |
| 7,043,325 B1 | 5/2006 | Adams, III | |
| 7,070,405 B2 | 7/2006 | Sreenivasan et al. | |
| 7,150,622 B2 * | 12/2006 | Choi | B29C 43/003 425/385 |
| 7,248,339 B2 | 7/2007 | Van Schothorst et al. | |
| 7,253,875 B1 | 8/2007 | Luttikhuis et al. | |
| 7,292,326 B2 | 11/2007 | Nimmakayala et al. | |
| 7,418,902 B2 | 9/2008 | Kruijt-Stegeman et al. | |
| 7,483,120 B2 | 1/2009 | Luttikhuis et al. | |
| 7,502,103 B2 | 3/2009 | Plug et al. | |
| 7,517,211 B2 * | 4/2009 | Kruijt-Stegeman | B29C 59/022 425/385 |
| 7,538,273 B2 | 5/2009 | Butler et al. | |
| 7,630,067 B2 * | 12/2009 | Nimmakayala | B82Y 10/00 356/139.04 |
| 7,676,088 B2 | 3/2010 | Simon | |
| 7,714,981 B2 | 5/2010 | Onvlee et al. | |
| 7,789,647 B2 * | 9/2010 | Kawakami | B82Y 10/00 425/149 |
| 7,946,029 B2 | 5/2011 | Rangelow | |
| 7,999,912 B2 * | 8/2011 | Van Der Pasch | G03F 7/70775 355/53 |
| 8,553,199 B2 | 10/2013 | Butler et al. | |
| 8,687,166 B2 | 4/2014 | Steijaert et al. | |
| 8,691,124 B2 | 4/2014 | Wuister et al. | |
| 8,908,144 B2 | 12/2014 | Groeneveld et al. | |
| 9,116,423 B2 | 8/2015 | Jeunink et al. | |
| 2004/0021866 A1 | 2/2004 | Watts et al. | |
| 2004/0124566 A1 * | 7/2004 | Sreenivasan | B81C 1/0046 264/494 |
| 2004/0263846 A1 * | 12/2004 | Kwan | G03F 7/70716 356/399 |
| 2005/0006343 A1 | 1/2005 | Choi et al. | |
| 2005/0037143 A1 * | 2/2005 | Chou | B29C 43/021 427/248.1 |
| 2005/0206879 A1 | 9/2005 | Van Dijk et al. | |
| 2005/0270516 A1 | 12/2005 | Cherala et al. | |
| 2005/0274693 A1 | 12/2005 | Heidari et al. | |
| 2005/0275125 A1 | 12/2005 | Kawakami et al. | |
| 2006/0055904 A1 * | 3/2006 | Baselmans | G03F 9/076 355/55 |
| 2006/0078807 A1 | 4/2006 | Chen | |
| 2006/0126058 A1 * | 6/2006 | Nimmakayala | B82Y 10/00 356/139.04 |
| 2006/0144275 A1 | 7/2006 | Kolesnychenko et al. | |
| 2006/0194123 A1 | 8/2006 | Mickan et al. | |
| 2006/0266244 A1 | 11/2006 | Kruijt-Stegeman et al. | |
| 2006/0267231 A1 * | 11/2006 | Van Santen | B29C 43/003 264/40.1 |
| 2007/0002336 A1 | 1/2007 | Pellemans et al. | |
| 2007/0013921 A1 | 1/2007 | Pellemans et al. | |
| 2007/0141191 A1 | 6/2007 | Kruijt-Stegeman et al. | |
| 2007/0248892 A1 | 10/2007 | Rangelow | |
| 2008/0035372 A1 | 2/2008 | Butler et al. | |
| 2008/0291413 A1 | 11/2008 | Steijaert et al. | |
| 2009/0147230 A1 | 6/2009 | Butler et al. | |
| 2010/0090161 A1 | 4/2010 | Mason | |
| 2011/0008483 A1 | 1/2011 | Jeunink et al. | |

FOREIGN PATENT DOCUMENTS

| | | |
|---|---|---|
| JP | 2006-332677 | 12/2006 |
| JP | 2007-251156 | 9/2007 |
| JP | 2007-281072 | 10/2007 |
| JP | 2007-535121 | 11/2007 |
| JP | 2007-318119 | 12/2007 |
| JP | 2009-027141 | 2/2009 |
| WO | 02/067055 | 8/2002 |

OTHER PUBLICATIONS

U.S. Final Office Action dated Oct. 6, 2017 in corresponding U.S. Appl. No. 12/820,492.
U.S. non-final Office Action issued in corresponding U.S. Appl. No. 12/820,492, dated May 18, 2018, 32 pages.
U.S. Non-Final Office Action dated Mar. 14, 2017 in corresponding U.S. Appl. No. 12/820,492.
J. Haisma "Mold-Assisted nanolithography: A process for reliable pattern replication", J. Vac. Sci. Technol, B14(6) Nov./Dec. 1996.
Japanese Office Action dated Aug. 21, 2012 in corresponding Japanese Patent Application No. 2010-147035.
U.S. Final Office Action issued in corresponding U.S. Appl. No. 12/820,492, dated Mar. 19, 2019.
U.S. Office Action Issued in corresponding U.S. Appl. No. 12/820,492, dated Oct. 7, 2019.

* cited by examiner

-- PRIOR ART --

IMPRINT LITHOGRAPHY APPARATUS AND METHOD

This application is a continuation of U.S. patent application Ser. No. 12/820,492, filed on Jun. 22, 2010, which claims priority and benefit under 35 U.S.C. § 119(e) to U.S. Provisional Patent Application No. 61/213,700, filed on Jul. 6, 2009 and to U.S. Provisional Patent Application No. 61/307,610, filed on Feb. 24, 2010. The content of each of the foregoing applications is incorporated herein in its entirety by reference.

FIELD

The present invention relates to an imprint lithography apparatus and method.

BACKGROUND

In lithography, there is an ongoing desire to reduce the size of features in a lithographic pattern in order to increase the density of features on a given substrate area. In photolithography, the push for smaller features has resulted in the development of technologies such as immersion lithography and extreme ultraviolet (EUV) lithography, which are however rather costly.

A potentially less costly road to smaller features (e.g. nanometer sized features, e.g., less than or equal to 50 nm, less than or equal 25 nm or less than or equal to 10 nm sized features) that has gained increasing interest is so-called imprint lithography, which generally involves the use of a "stamp" (often referred to as an imprint lithography template) to transfer a pattern onto a substrate. An advantage of imprint lithography is that the resolution of the features is not limited by, for example, the emission wavelength of a radiation source or the numerical aperture of a projection system. Instead, the resolution is mainly limited to the pattern density on the imprint lithography template.

Imprint lithography involves the patterning of an imprintable medium on a surface of a substrate to be patterned. The patterning may involve bringing together a patterned surface of an imprint lithography template and a layer of imprintable medium (e.g., moving the imprint lithography template toward the imprintable medium, or moving the imprintable medium toward the imprint lithography template, or both) such that the imprintable medium flows into recesses in the patterned surface and is pushed aside by protrusions on the patterned surface, to adopt the topography of that patterned surface. The recesses define pattern features of the patterned surface of the imprint template. Typically, the imprintable medium is flowable when the patterned surface and the imprintable medium are brought together. Following patterning of the imprintable medium, the imprintable medium is suitably brought into a non-flowable or frozen state (i.e. a fixed state), for example by illuminating the imprintable medium with actinic radiation. The patterned surface of the imprint lithography template and the patterned imprintable medium are then separated. The substrate and patterned imprintable medium are then typically processed further in order to pattern or further pattern the substrate. The imprintable medium may be provided in the form of droplets on the surface of a substrate to be patterned, but may alternatively be provided using spin coating or the like.

SUMMARY

It is desirable to imprint a pattern on top of a pattern which has previously been provided on a substrate. Where this is done, the imprint template should be aligned with the previously provided pattern, so that the newly imprinted pattern is aligned with the previously provided pattern.

A problem which may arise is that the size and/or shape of the imprint template may change over time, and this change may have a detrimental effect upon the alignment of the imprint template and the substrate.

It is desirable, for example, to provide an imprint lithography apparatus and method which overcomes or substantially mitigates the above disadvantage or another disadvantage.

According to an aspect of the invention, there is provided an imprint lithography apparatus comprising an imprint template holder arrange to hold an imprint template, and a plurality of position sensors which are configured to measure change of the size and/or shape of the imprint template, wherein the position sensors are mechanically isolated from the imprint template.

According to an aspect of the invention, there is provided a lithography method comprising using an imprint template to imprint a pattern onto a substrate, the method further comprising measuring changes of the size and/or shape of the imprint template while imprinting the pattern onto the substrate.

BRIEF DESCRIPTION OF THE DRAWINGS

Specific embodiments of the invention will be described with reference to the accompanying figures, in which.

DETAILED DESCRIPTION

Figure 1A:
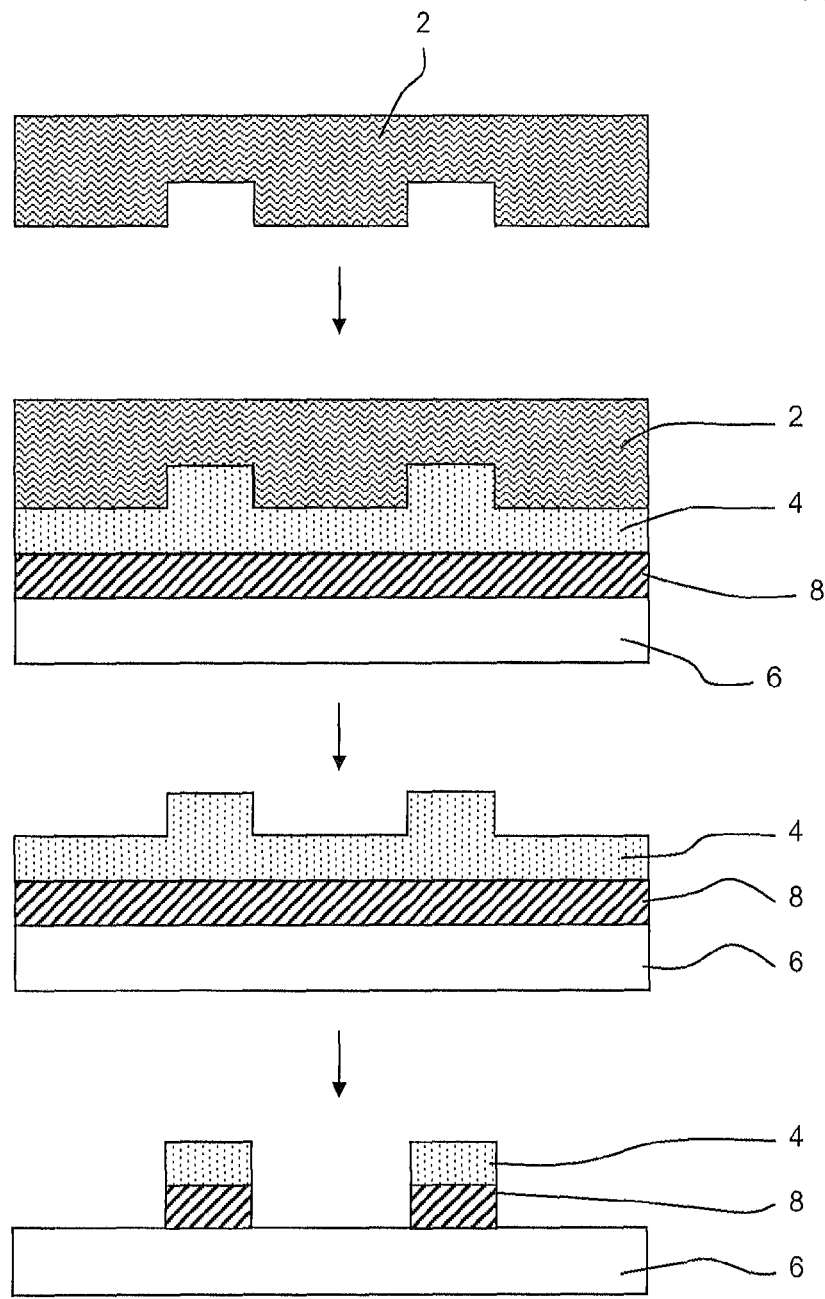
FIGS. 1a and 1b schematically depict examples of, respectively, hot imprint, and UV imprint lithography.
Figure 1B:
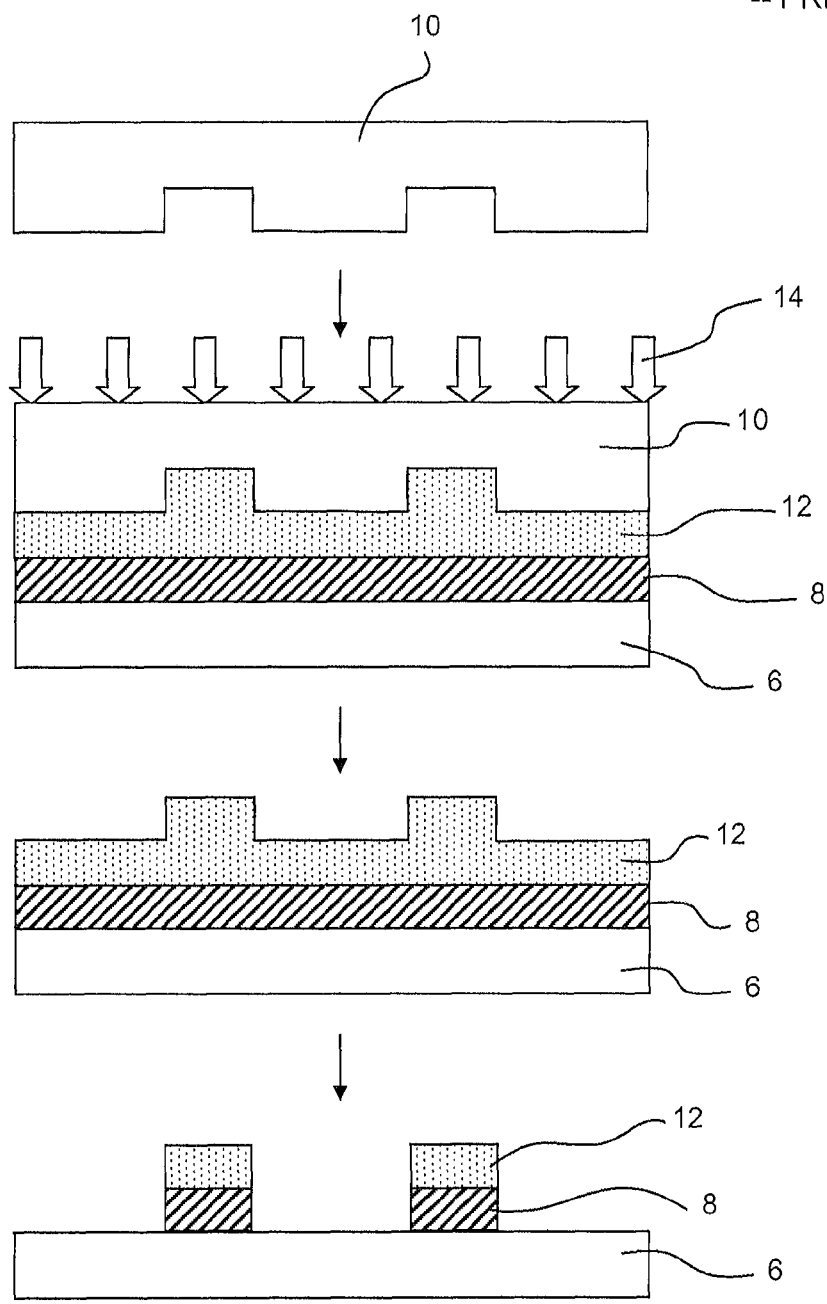

Examples of approaches to imprint lithography are schematically depicted in FIGS. 1a to 1b.

FIG. 1a shows an example of so-called hot imprint lithography (or hot embossing). In a typical hot imprint process, a template 2 is imprinted into a thermosetting or a thermoplastic imprintable medium 4, which has been cast on the surface of a substrate 6. The imprintable medium 4 may be, for example, resin. The resin, for instance, may be spin coated and baked onto the substrate surface or, as in the example illustrated, onto a planarization and transfer layer 8 of the substrate 6. When a thermosetting polymer resin is used, the resin is heated to a temperature such that, upon contact with the template, the resin is sufficiently flowable to flow into the pattern features defined on the template. The temperature of the resin is then increased to thermally cure (crosslink) the resin so that it solidifies and irreversibly adopts the desired pattern. The template 2 may then be removed and the patterned resin cooled. In hot imprint lithography employing a layer of thermoplastic polymer resin, the thermoplastic resin is heated so that it is in a freely flowable state immediately prior to imprinting with the template 2. It may be necessary to heat a thermoplastic resin to a temperature considerably above the glass transition temperature of the resin. The template is pressed into the flowable resin and then cooled to below its glass transition temperature with the template 2 in place to harden the pattern. Thereafter, the template 2 is removed. The pattern will consist of the features in relief from a residual layer of the resin which may then be removed by an appropriate etch process to leave only the pattern features. Examples of thermoplastic polymer resins used in hot imprint lithography processes are poly (methyl methacrylate), polystyrene, poly (benzyl methacrylate) or poly (cyclohexyl methacrylate). For more information on hot imprint, see e.g. U.S. Pat. Nos. 4,731,155 and 5,772,905.

FIG. 1*b* shows an example of UV imprint lithography, which involves the use of a transparent or translucent template which is transmissive to UV and a UV-curable liquid as imprintable medium (the term "UV" is used here for convenience but should be interpreted as including any suitable actinic radiation for curing the imprintable medium). A UV curable liquid is often less viscous than a thermosetting or thermoplastic resin used in hot imprint lithography and consequently may move much faster to fill template pattern features. A quartz template 10 is applied to a UV-curable resin 12 in a similar manner to the process of FIG. 1*a*. However, instead of using heat or temperature cycling as in hot imprint, the pattern is frozen by curing the imprintable medium 12 with UV radiation 14 that is applied through the quartz template 10 onto the imprintable medium 12. After removal of the template 10, the imprintable medium 12 is etched. A particular manner of patterning a substrate through UV imprint lithography is so-called step and flash imprint lithography (SFIL), which may be used to pattern a substrate in small steps in a similar manner to optical steppers conventionally used in IC manufacture. For more information on UV imprint, see e.g. U.S. Patent Application Publication No. 2004-0124566, U.S. Pat. No. 6,334,960, PCT Patent Application Publication No. WO 02/067055, and the article by J. Haisma entitled "Mold-assisted nanolithography: A process for reliable pattern replication", J. Vac. Sci. Technol. B14(6), November/December 1996.

Combinations of the above imprint techniques are possible. See, e.g., U.S. Patent Application Publication No. 2005-0274693, which mentions a combination of heating and UV curing an imprintable medium.

It is desirable to imprint a pattern on top of a pattern which has previously been provided on a substrate. When this is done, the imprint template should be aligned with the previously provided pattern, so that the newly imprinted pattern is aligned with the previously provided pattern. Alignment of the imprint template to the previously provided pattern may include ensuring that the positions of the imprint template and the substrate substantially correspond with one another.

In addition, alignment may include adjusting the shape and/or size of the imprint template such that the shape and/or size of the pattern to be imprinted is matched to the shape and/or size of the previously provided pattern. One or more piezo-electric actuators may be used to adjust the shape and/or size of the imprint template.

In some instances, movement of a piezo-electric actuator may not be translated directly into a change of shape and/or size of the imprint template. This may occur, for example, because the imprint template is relatively stiff, and thus does not deform easily. A frame which supports the piezo-electric actuator may deform instead of the imprint template deforming. In some instances, a support frame may deform to some extent and the imprint template may deform to some extent.

Given that the actuation of the piezo-electric actuator is not necessarily directly translated into distortion of the imprint template, it cannot be assumed that a desired change of shape and/or size of the imprint template may be achieved merely by applying a corresponding change of size to the piezo-electric actuator distributed around the imprint template. This problem and/or other problem is addressed by an embodiment of the present invention, which measures change of the shape and/or size of the imprint template using position sensors that are not affected by distortion of a support frame which supports the piezo-electric actuator. An embodiment of the invention may allow the size and/or shape of the imprint template to be monitored during operation of the lithography apparatus. An embodiment of the invention may allow the size and/or shape of the imprint template to be held constant, or substantially constant, during operation of the lithography apparatus. An embodiment of the invention may allow alignment of the imprint template with a substrate to be adjusted to take into account change of the size and/or shape of the imprint template.

Figure 2A:
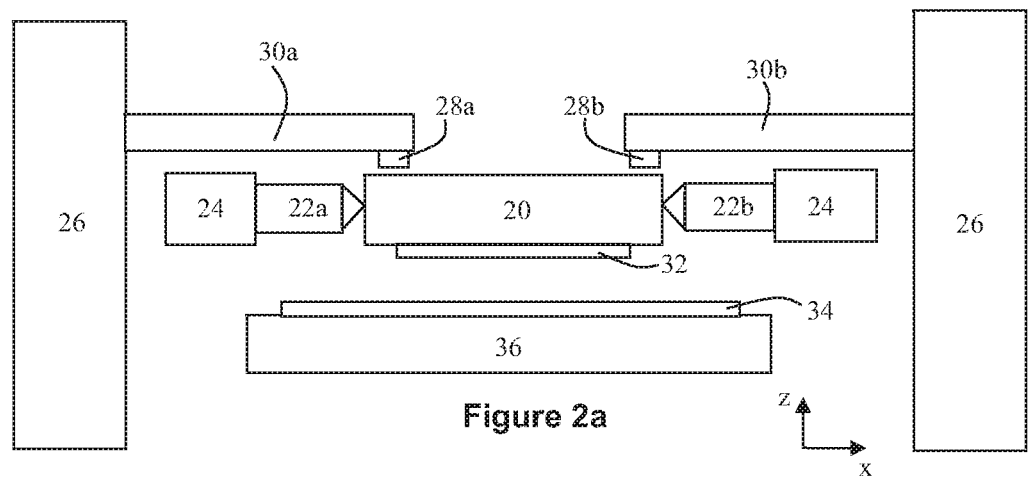
FIGS. 2a and 2b schematically depict an imprint lithography apparatus according to an embodiment of the invention.
Figure 2B:
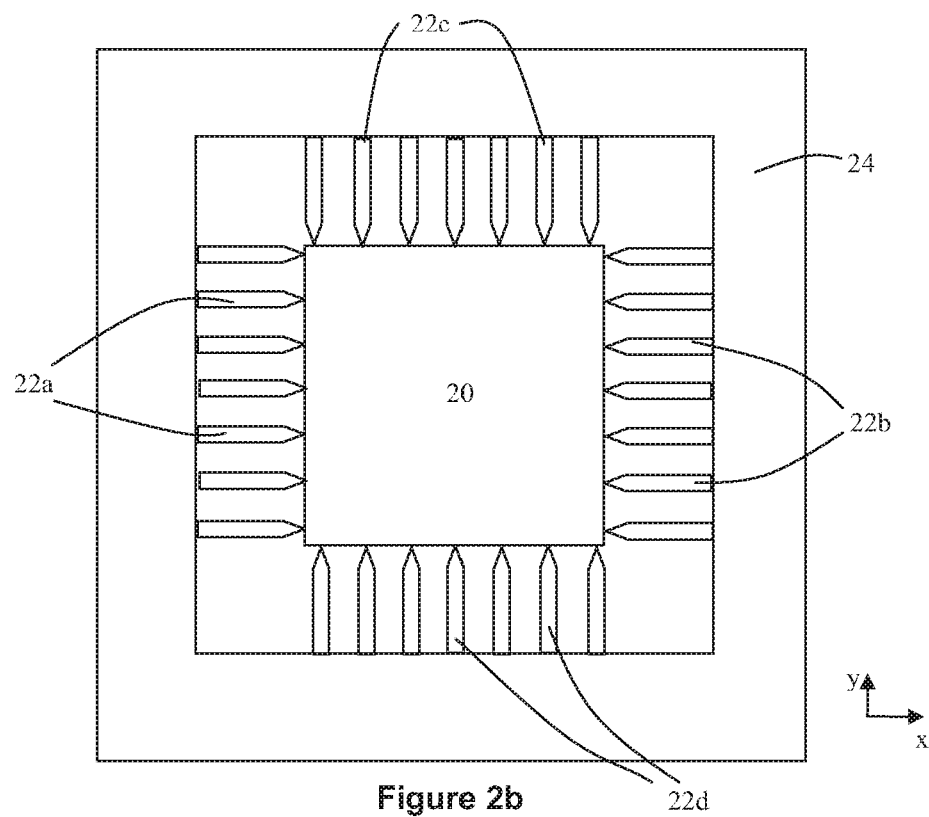

FIG. 2 shows schematically an imprint lithography apparatus according to an embodiment of the invention. FIG. 2*a* shows the imprint lithography apparatus viewed in cross-section, and FIG. 2*b* shows the imprint lithography apparatus viewed from above. Some parts of the apparatus are omitted from FIG. 2*b* for ease of illustration.

The imprint lithography apparatus comprises one or more piezo-electric actuators 22*a-d* to hold an imprint template 20 (the piezo-electric actuators may be considered to comprise an imprint template holder). The piezo-electric actuators 22*a-d* are provided around the perimeter of the imprint template 20, and are held by a first support frame 24. A second support frame 26 surrounds the first support frame 24 but is not in contact with the first support frame. One or more position sensors 28*a,b* are held by arms 30*a,b* which extend from the second support frame 26. The position sensors 28*a,b* are mechanically isolated from the imprint template 20. The imprint template 20 includes a raised portion, referred to as a mesa 32, upon which a pattern to be imprinted is provided.

A substrate 34 is held by a substrate table 36. The substrate table 36 is movable in the x and y directions, and may also be rotated about the z-axis. One or more position sensors (not shown) are used to measure the position of the substrate table 36 relative to the second support frame 26.

In use, the substrate table is moved in the x and y directions, and rotated about the z-axis until the substrate 34 is aligned with the imprint template 20. In an embodiment, the imprint template 20 is then moved downwards until it contacts imprintable medium provided on the substrate 34. Actinic radiation, or some other mechanism, is used to freeze imprintable medium (e.g. via curing) on the substrate such that a pattern imprinted by the imprint template 20 is frozen in the imprintable medium.

The size and/or shape of the imprint template 20 may be adjusted using the piezo-electric actuators 22*a-d*. For example, if the imprint template 20 is too large, the piezo-electric actuators 22*a-d* may be used to apply force to the imprint template and thereby reduce it to a desired size. If, for example, part of the imprint template is too wide but another part has a desired width, then piezo-electric actuators 22*a-d* which are located at the too wide portion of the imprint template may be used to apply force to the imprint template and thereby reduce the width of the imprint template to the desired width.

Adjustment of the size and/or shape of the imprint template 20 may continue until the size and/or shape of the imprint template corresponds with a desired size and/or shape (or lies within a predetermined threshold of the desired size and/or shape).

The size and/or shape of the imprint template is not monitored by merely monitoring voltages which are applied to the piezo-electric actuators 22*a-d*. This is because the stiffness of the imprint template 20 is such that the piezo-electric actuators 22*a-d* may cause the first support frame 24 to deform as well as changing the shape and/or size of the imprint template 20. Thus, it cannot be assumed that all movement of a piezo-electric actuator is directly transferred to the imprint template 20.

Change of the size and/or shape of the imprint template is measured by the position sensors 28*a,b*. The position sensors 28*a,b* are not mechanically connected to the piezo-electric actuators 22*a-d*, or to the first support frame 24, but instead are mechanically isolated from them. Thus, deformation of the first support frame 24, for example, does not affect the position measurements provided by the position sensors 28*a,b*. The position sensors are mounted on the second support frame 26 (via arms 30*a-b*), and provide position measurements in the reference frame of the second support frame 26. In FIG. 2, the measuring portion of the position sensors 28*a,b* are shown as being located above the imprint template but additionally or alternatively may be located below the imprint template.

Figure 3A:
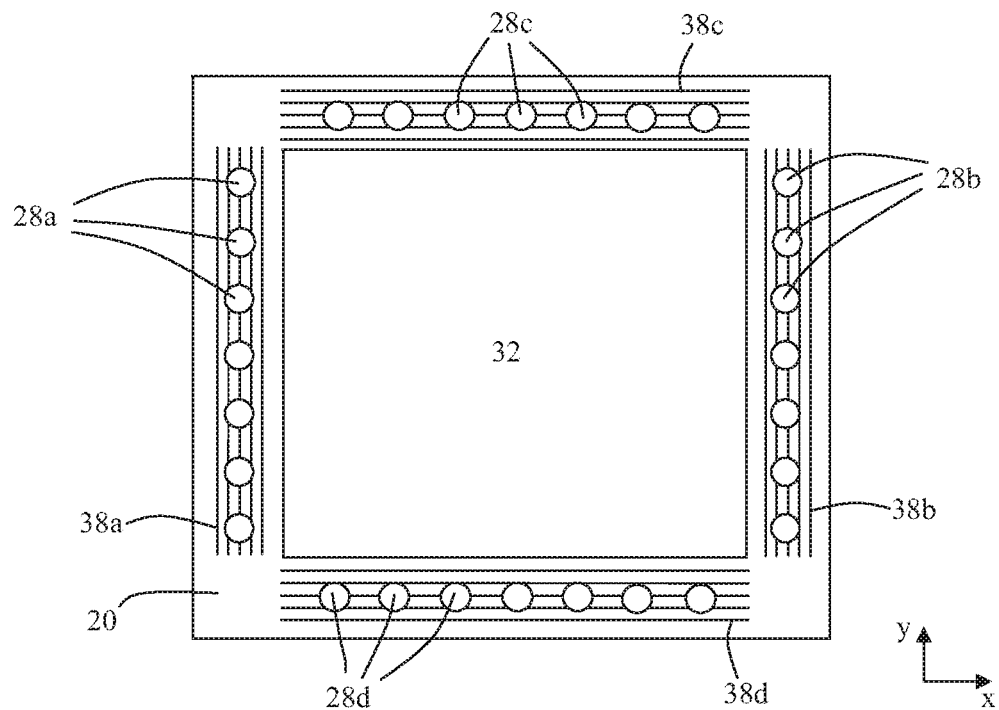
FIGS. 3a and 3b schematically depict the embodiment of FIGS. 2a and 2b in more detail.
Figure 3B:
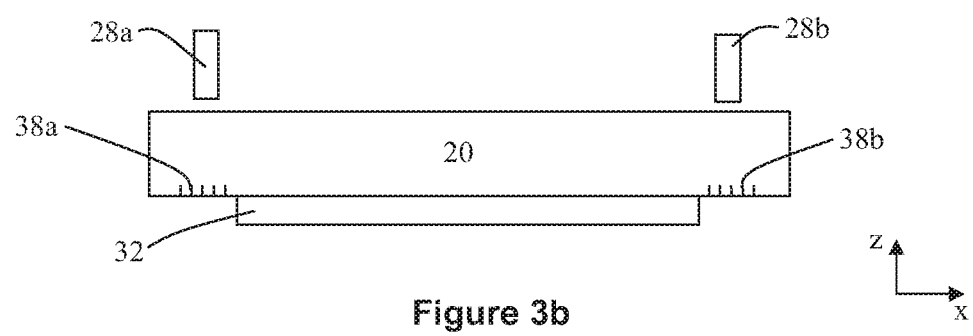

FIG. 3 shows schematically part of the embodiment of FIG. 2 in more detail. FIG. 3*a* shows the imprint template 20 and position sensors 28*a-d* viewed from above, and FIG. 3*b* shows the imprint template and position sensors 28*a,b* viewed from one side in cross-section.

The imprint template 20 is provided with four sets of lines 38*a-d*, the lines being provided in the perimeter of the imprint template. Each set of lines 38*a-d* (which may be referred to as grid lines) comprises equally spaced lines which run substantially parallel to an adjacent edge of the mesa 32. Each position sensor 28*a-d* is configured to provide a position measurement by determining the position of lines 38*a-d* which lie beneath that position sensor. The position sensors 28*a-d* and the lines 38*a-d* act as linear encoders. Each linear encoder provides a measurement of change of the position of that portion of the imprint template perimeter at which it is located. The term 'imprint template perimeter' is not intended to be limited to the edge of the imprint template 20, but may for example include that portion of the imprint template which lies outside of the mesa 32. In an embodiment (not illustrated), the position sensors may be arranged to measure change of the size and/or shape of the mesa 32 of the imprint template 20.

The position sensors 28*a-d* are mechanically isolated from the imprint template 20, and may for example be attached to the second support frame 26 (not shown in FIG. 3). Although each set of lines 38*a-d* comprises only five lines, in practice many more lines than this may be provided. The lines may be referred to as graduations. The lines may be provided with any suitable separation, the separation being selected in order to enable position measurements to be obtained with a desired accuracy.

Although the lines 38*a-d* are shown as being continuous on each side of the imprint template 20, they may be discontinuous. For example, lines may be provided beneath each of the position sensors 28*a-d*, but not between the position sensors.

The lines 38*a-d* may for example be formed from chromium, or any other suitable substance. Although the lines 38*a-d* are shown as being provided on the bottom surface of the imprint template 20, they may alternatively be provided on a top surface of the imprint template. Providing the lines on the bottom surface of the imprint template 20 may provide an advantage that the positions of the lines may correspond more closely with the size and/or shape of the mesa 32 (since the lines are closer to the mesa in the z-direction).

The linear encoders may for example be optical, magnetic, inductive, or may have any other suitable form. The linear encoders may for example provide measurement with an accuracy of around 1 nm. The linear encoders may for example be made by Heidenhain of Traunreut, Germany.

Since several position sensors 28*a-d* are provided along each side of the imprint template 20, the position sensors are able to detect change of shape of the imprint template 20, as well as change of size of the imprint template 20. The position sensors 28*a-d* may also measure translation of the imprint template in the x and/or y directions, and rotation of the imprint template about the z-axis.

In some instances, change of the shape and/or size of the mesa 32 may be different to change of the shape and/or size of the imprint template 20. For this reason, a computational model may be used to calculate change of the shape and/or size of the mesa 32 based upon change of the shape and/or size of the imprint template 20 as measured by the position sensors 28*a-d*.

Although seven position sensors 28*a-d* are shown on each side of the imprint template 20, any number of position sensors may be used. The number of position sensors 28*a-d* may be the same as the number of piezo-electric actuators 22*a-d*, or may be different.

Figure 4:
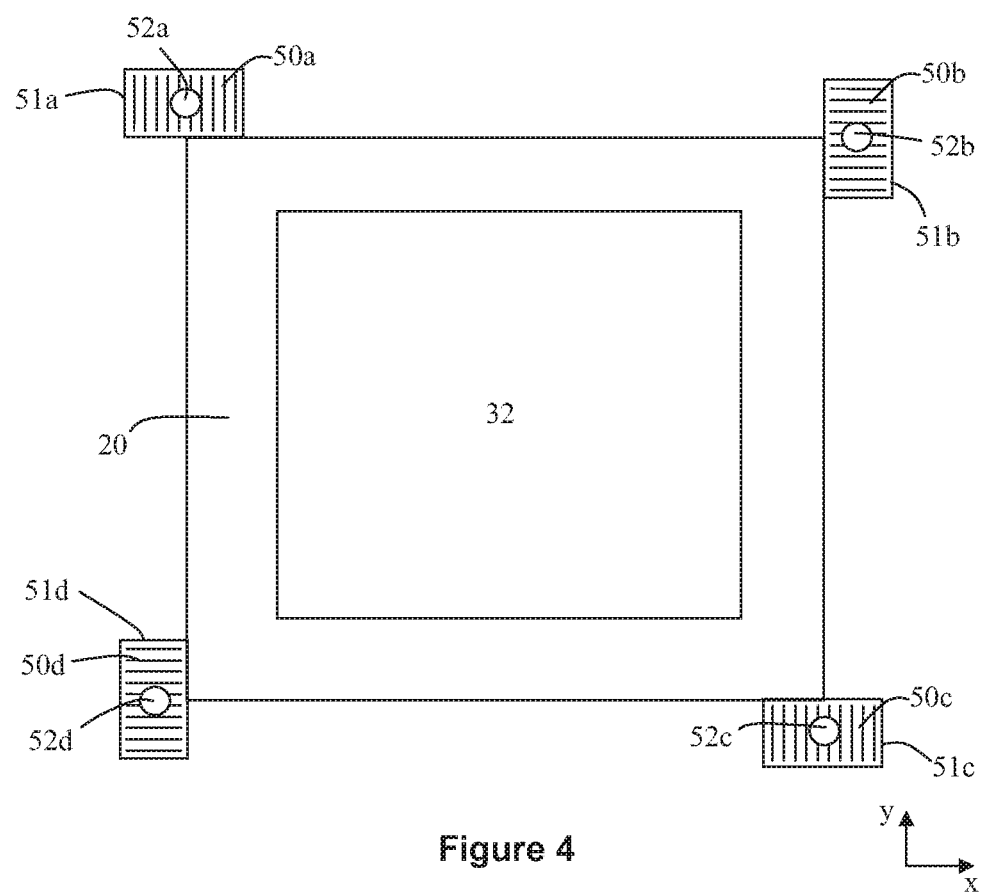
FIG. 4 schematically depicts a variation of the arrangement of the embodiment of FIG. 2.

FIG. 4 shows schematically a further arrangement of an embodiment of the invention. The imprint template 20 is provided with four sets of lines 50*a-d*, each set of lines being provided on a plate 51*a-d* which is fixed to a corner of the imprint template (a plate is provided at each corner). A position sensor 52*a-d* is provided under or over each set of lines 50*a-d*. Each position sensor 52*a-d* and associated set of lines 50*a-d* acts as a linear encoder. Each linear encoder provides a measurement of change of the position of that portion of the imprint template perimeter to which a plate 51 *a-d* is attached. The measurements may be considered to be indirect measurements of change of the positions of portions of the imprint templates. Although the sets of lines 50*a-d* are provided on plates 51*a-d*, they may be provided on any suitable structure.

The position sensors 52*a-d* are mechanically isolated from the imprint template 20, and for example may be supported by the second support frame 26 (not shown in FIG. 4). Although each set of lines comprises only ten lines, in practice many more (or less) lines than this may be provided. Two of the sets of lines 50*a,c* are configured to provide position measurements in the x-direction, and two of the sets of lines 50*b,d* are configured to provide position measurements in the y-direction. The sets of lines 50*a-d* and position sensors 52*a-d* allow change of the size of the imprint template 20 to be measured. They may in addition allow translation of the imprint template 20 in the x and y-directions to be measured, along with rotation of the imprint template about the z-axis.

The lines may be provided with any suitable separation, this separation being selected in order to enable position measurements to be obtained with a desired accuracy. The lines may be referred to as graduations.

Linear encoders may be provided at any suitable location. A set of lines may be provided at any suitable location on the imprint template, or at any suitable location which is connected to the imprint template.

Although the embodiments shown in FIGS. 3 and 4 use linear encoders, other types of position sensor may be used to measure change of the size and/or shape of the imprint template 20. For example, one or more imaging sensors may be used to monitor the position of alignment marks provided around the perimeter of the imprint template. One or more non-imaging sensors may be used, for example to detect diffraction from alignment gratings provided around the perimeter of the imprint template.

Although the position sensors 28*a*-*d* are shown in FIG. 2 as being connected to the second support frame 26 by arms 30*a*-*b*, the position sensors may be supported in any suitable manner. For example, the second support frame 26 may include an overhang from which the position sensors 28*a*-*d* are provided. The position sensors may be supported by a support which is not mechanically connected to the second support frame 26. For example, the position sensors 28*a*-*d* may be disconnected from the second support frame 26, and one or more interferometers may be provided which measure the separation between the second support frame and the position sensors. This allows the position sensors 28*a*-*d* to provide a measurement of the position of the imprint template 20 relative to the second support frame 26.

Figure 5A:
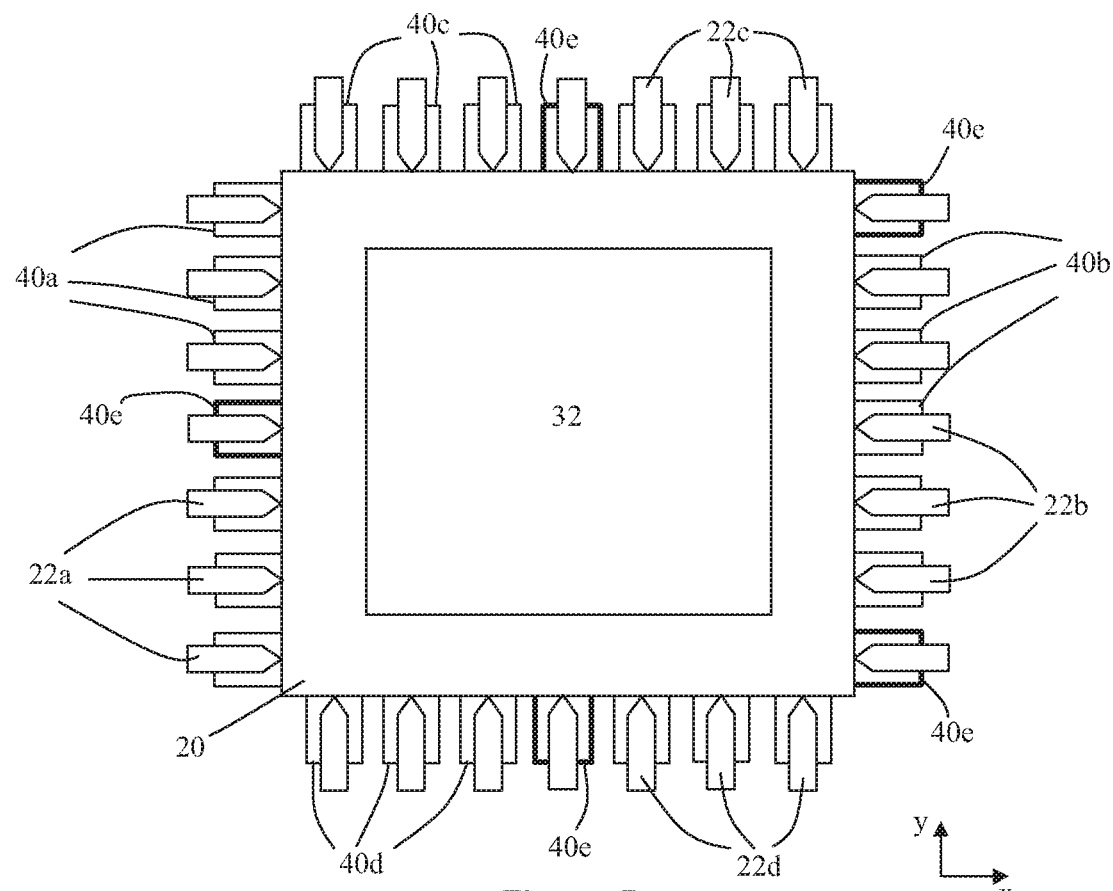
FIGS. 5a and 5b schematically depict a further embodiment of the invention.
Figure 5B:
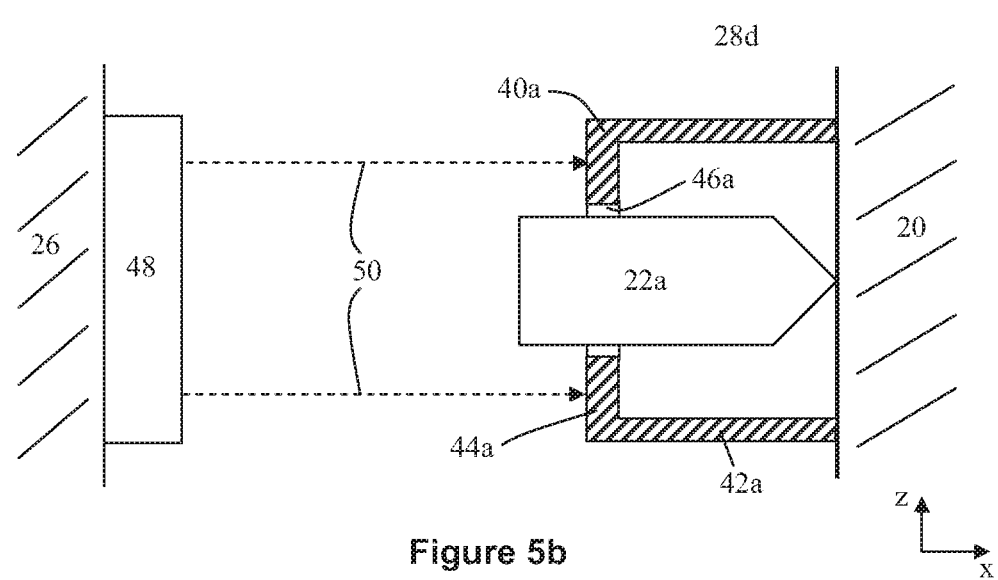

A further embodiment of the invention is shown schematically in FIG. 5. FIG. 5*a* shows the imprint template 20 viewed from above, together with the piezo-electric actuators 22*a*-*d* which are distributed around the perimeter of the imprint template. A reflector 40*a*-*d* is associated with each piezo-electric actuator 22*a*-*d*. A single reflector 40*a* and piezo-electric actuator 22*a* are shown in more detail in FIG. 5*b*. FIG. 5*b* shows the reflector 40*a* and piezo-electric actuator 22*a* in cross-section viewed from one side, together with an interferometer 48 connected to the second support frame 26, and with the imprint template 20.

Each reflector 40*a* surrounds (or substantially surrounds) an actuator 22*a*, and comprises a mounting portion 42*a* and a reflecting portion 44*a*. The mounting portion extends outwardly from a side face of the imprint template, and the reflecting portion 44*a* is substantially parallel to the side face of the imprint template. The reflecting portion 44*a* is provided with an opening 46*a* through which the piezo-electric actuator 22*a* extends. The opening 46*a* is sufficiently large that the piezo-electric actuator 22*a* is not in contact with the reflector 40*a*. An outer surface of the reflecting portion 44*a* is reflective.

The interferometer 48 is configured to emit one or more laser beams 50 which are directed towards the reflecting portion 44*a* of the reflector 40*a*. The laser beams 50 are reflected by the reflecting portion 44*a* of the reflector 40*a*, and are detected by the interferometer 48. The interferometer 48 thereby determines the distance between the interferometer 48 and the reflector 40*a*. The interferometer 48 is mechanically isolated from the imprint template 20, and is connected to the second support frame 26. The reflector 48 is connected to the imprint template 20 (and is not connected to the piezo-electric actuator 22*a*). Thus, the interferometer 48 may be used to measure change of the distance between the second support frame 26 and the imprint template 20.

Referring again to FIG. 5*a*, the reflectors 40*a*-*d* allow the position of the imprint template 20 to be determined at a plurality of locations around the perimeter of the imprint template. Each reflector 40*a*-*d* has an interferometer 48 or interferometer beam 50 associated with it. These interferometers and/or beams are omitted from FIG. 5*a* for ease of illustration. The reflectors 40*a*-*d* and associated interferometers and/or beams allow change of the size and/or shape of the imprint template 20 to be measured. The reflectors 40*a*-*d* and associated interferometers and/or beams may be considered to be position sensors which are configured to measure change of the positions of portions of the imprint template perimeter. In this context, a 'portion of the imprint template perimeter' is that part of the imprint template to which a reflector 40*a*-*d* is attached.

Although seven reflectors 40*a*-*d* are shown on each side of the imprint template 20, any number of reflectors (and associated interferometers and/or beams) may be used. The number of reflectors 40*a*-*d* may be the same as the number of piezo-electric actuators 22*a*-*d*, or may be different.

The number of reflectors may be reduced for example to five reflectors. The five reflectors may be a subset of the reflectors shown in FIG. 5*a*. Five reflectors which may be used are labeled 40*e* in FIG. 5*a*, and are shown with thicker lines for ease of identification. One of the reflectors 40*e* is provided on a left hand side of the imprint template 20 in the middle of that side of the imprint template, and two of the reflectors are provided on a right hand side of the imprint template at either end of that side of the imprint template. The remaining reflectors 40*e* are provided on the top side of the imprint template 20 in the middle of that side, and on the bottom side of the imprint template in the middle of that side. This combination of reflectors is capable of measuring change of the size of the imprint template 20, in addition to being capable of measuring translation of the imprint template in the x and y directions, and rotation of the imprint template about the z-axis.

Referring to FIG. 5 in combination with FIG. 2, the interferometer(s) 48 may be considered to be equivalent to the detectors 28*a,b*. Although the interferometer does not directly measure the position of the imprint template 20, but instead measures the positions of reflectors 40*a*-*d*, it provides an equivalent measurement since the reflectors are directly connected to the imprint template.

The first support frame is not shown in FIG. 5 for ease of illustration. The first support frame may have any suitable form. For example, the first support frame may be a frame which is provided with openings through which the laser beams 50 may pass. Alternatively, the first support frame may comprise an open or semi-open structure which is configured such that it does not block the laser beams 50.

An embodiment of the invention may be used to monitor changes of size and/or shape of the imprint template 20. Such changes may occur for example due to heat being absorbed by the imprint template 20 during operation of the lithography apparatus. The heat may arise for example via absorption of actinic radiation by the imprint template 20. Alternatively or additionally, heat may be transferred from the substrate 34 to the imprint template 20.

The embodiments shown in FIGS. 2 and 3 measure change of the size and/or shape of the imprint template 20 directly. The embodiments shown in FIGS. 4 and 5 measure change of the size and/or shape of the imprint template structures which are connected to the imprint template 20 and which move with the imprint template. The position of any suitable structure attached to the imprint template may be measured in order to measure change of the size and/or shape of the imprint template.

In a further embodiment of the invention, the position of a portion of the piezo-electric actuator 22*a*-*d* which is close to the imprint template 20 may be used to measure change of the size and/or shape of the imprint template. For example, encoder lines which may be read by a position sensor may be provided on a piezo-electric actuator, at a location on the piezo-electric actuator which is adjacent to the imprint template. These lines will move with the imprint template, and thus may be used by the position sensor to monitor the position of the adjacent portion of the imprint template. If the lines were provided at a different location, for example midway along the piezo-electric actuator, then they would not be suitable for providing a measurement of the position of the adjacent portion of the imprint template 20. This is because the position sensor would not be able to discriminate between movement of the first support frame 24 and movement of the imprint template 20. However, if the lines are provided at an end of the piezo-electric actuator adjacent to the imprint template 20, it may be assumed that movement of the lines corresponds to movement of the imprint template 20 rather than deformation of the first support frame 24.

The second support frame 26 provides a reference frame relative to which measurement of the imprint template 20 size and/or shape is determined. Similarly, the second support frame 26 provides a reference frame relative to which measurement of the position of the substrate table 36 is determined. Any other suitable reference frame may be used.

Embodiments of the invention may be used to measure change of the size and/or shape of the imprint template 20 during operation of the lithography apparatus. The size and shape of the imprint template 20 may be held constant (or substantially constant) during operation of the lithography apparatus. This may be done by using the piezo-electric actuators 22a-d to apply force at appropriate locations around the perimeter of the imprint template 20 when change of the size and/or shape of the imprint templates is detected. The position detectors 28a-d (or interferometers 42) and piezo-electric actuators 22a-d may be considered to form a control loop which allows the size and/or shape of the imprint template 20 to be controlled. The size and/or shape of the imprint template 20 may for example be fixed (or held substantially constant) during operation of the lithography apparatus.

In an alternative approach, instead of fixing the size and/or shape of the imprint template 20 (or holding them substantially constant), changes of the size and/or shape of the imprint template as measured by the position sensors 28a-d (or interferometer(s) 48) may be used to adjust the position at which the imprint template 20 and the substrate 32 are considered to be aligned. For example, if the imprint template 20 were to expand, then the position at which the imprint template is considered to be aligned with the substrate 32 may be adjusted appropriately such that misalignment across a pattern to be printed is reduced or minimized. This may be achieved, for example, by aligning the center of the imprint template 20 with the center of a previously provided pattern on the substrate 32.

In a further approach, the size and/or shape of the imprint template 20 may be adjusted in order to match or resemble the size and/or shape of a pattern already present on the substrate. The adjustment of the size and/or shape of the imprint template 20 may be performed using the piezo-electric actuators 22a-d, with the size and/or shape of the imprint template being monitored by the position sensors 28a-d (or interferometer(s) 48). The size and/or shape of a pattern already present on the substrate may be different at different locations on the substrate (for example, the size of the pattern may vary across the substrate). Where this is the case, the adjustment of the size and/or shape of the imprint template 20 may improve alignment of the imprint template to the patterns already present on the substrate. The position detectors 28a-d (or interferometer(s) 48) and piezo-electric actuators 22a-d may be considered to form a control loop which facilitates the adjustment of the size and/or shape of the imprint template.

Figure 6:
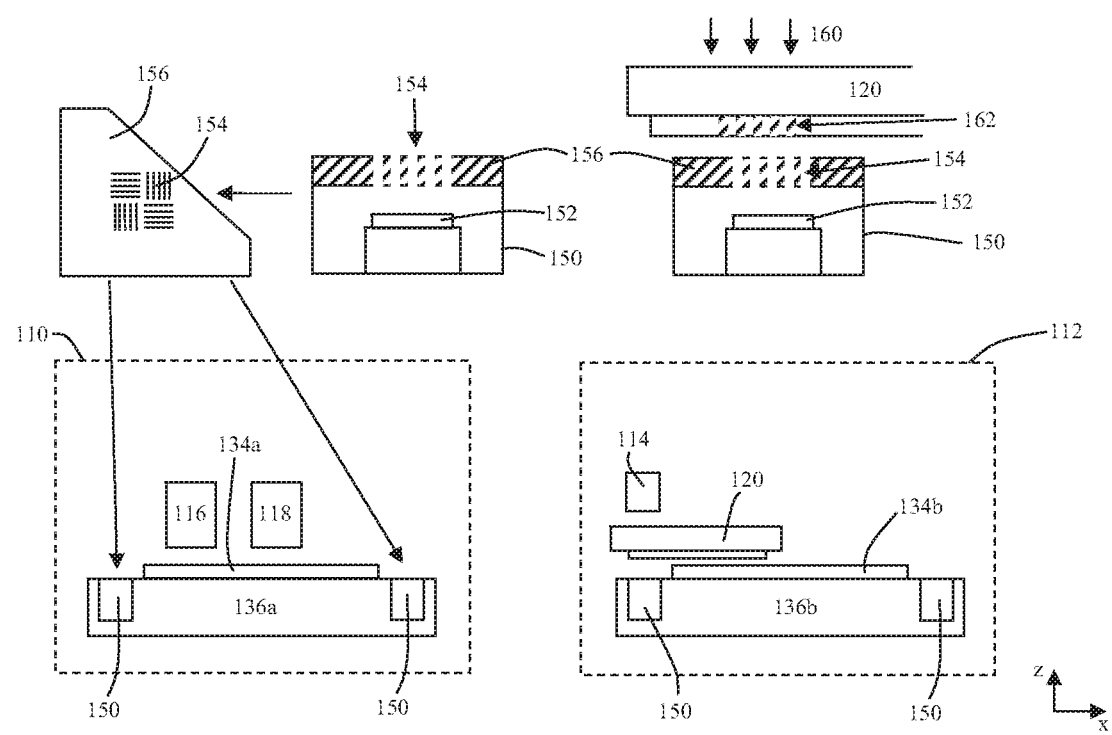
FIG. 6 schematically depicts a further embodiment of the invention.

A further embodiment of the invention is illustrated schematically in FIG. 6. In this embodiment, a lithography apparatus has a first substrate table 136a, a second substrate table 136b, and an imprint template 120. The lithography apparatus may be considered to comprise two modules, a measurement module 110 and an imprint module 112. The measurement module 110 is provided with various measurement apparatus 116, 118 (described further below) but does not include an imprint template. The imprint module 112 includes a measurement apparatus 114 and the imprint template 120. In an embodiment, the second substrate table 136b may be arranged not hold a substrate, i.e., simply a table. For example, the second table 136 may comprise measurement apparatus to, for example, measure the imprint template.

In use, a substrate 134a is provided on the first substrate table 136a. Measurement apparatus 116, 118 are used to measure various properties of the substrate 134a. The first substrate table 136a and the second substrate table 136b are then swapped over, such that the first substrate table 136a is located in the imprint module 112 of the lithography apparatus and the second substrate table 136b is located in the measurement module 110 of the lithography apparatus. In a further embodiment, the first substrate table 136a may be moved to the imprint module 112 from the measurement module 110 while the second substrate table 136b is moved from the imprint module 112 to a further location or module (e.g., a further measurement module) (not shown). In such a case, after imprinting substrate 134a, the first substrate table 136a may return to the measurement module 110 from the imprint module 112 and the second substrate table 136b may return to the imprint module 112 from the further location or module.

Once the substrate 134a is at the imprint module 112, the imprint template 120 is then used to imprint patterns onto the substrate 134a, taking into account the substrate properties measured in the measurement module 110. In the case of a swap embodiment, the first substrate table 136a and the second substrate table 136b may then be swapped over, such that the second substrate table 136b is located in the imprint module 112 of the lithography apparatus and the first substrate table 136a is located in the measurement module 110 of the lithography apparatus. Separating measurement and imprint in this manner may improve the throughput of the lithography apparatus.

Each substrate table 136a,b is provided with two or more substrate table alignment detectors 150. Each substrate table alignment detector 150 is provided in a recess in the substrate table 136a,b, and comprises a detector 152 which is located beneath an alignment grating 154 formed in the surface 156 of the substrate table 136a,b. The surface 156 within which the alignment grating 154 is formed may be, for example, a plate which forms part of the substrate table.

A first measurement apparatus 116 of the measurement module 110 is an alignment sensor, which may be used to measure the positions of alignment marks provided on the substrate 134a,b. The alignment sensor may, for example, direct one or more beams of non-actinic radiation towards alignment marks (e.g. gratings) provided on a substrate 134a,b, and detect diffraction from those alignment marks. Other types of alignment sensor may be used. The alignment sensor 116 may be used to determine the positions of a plurality of alignment marks provided on the substrate 134a,b, and thereby determine locations at which the imprint template 120 should imprint patterns onto the substrate. The alignment sensor 116 also measures the positions of the alignment gratings 154 provided on the substrate table 136a,b. This allows the positions of the substrate alignment marks to be defined relative to the positions of the substrate table alignment gratings 154. If the substrate table alignment grating 154 is such that it cannot be measured by the alignment sensor 116, then an alignment mark which can be measured by the alignment sensor may be provided on the substrate table. The alignment mark has a known position relative to the substrate table alignment grating 154, thereby allowing the alignment sensor 116 to measure the position of the substrate table alignment grating 154 indirectly.

A level sensor 118 is provided in the measurement module 110 of the lithography apparatus. The level sensor 118 is configured to map the topology of the surface of the substrate 134a,b. The topology of the surface of the substrate 134a,b may be taken into account when imprinting the patterns onto the substrate using the imprint template 120.

The imprint module 112 includes a radiation output 114 (comprising or connected to a radiation source). The radiation output is configured to direct non-actinic radiation 160 through an alignment grating 162 provided on the imprint template 120, through the substrate table grating 154, and onto the detector 152. The intensity of radiation detected by the detector 152, as a function of the relative position between the alignment grating 162 of the imprint template 120 and the substrate table 136a,b, may be used to determine the position of the substrate table 136a,b relative to the imprint template 120. This measurement is repeated for other substrate table alignment detectors 150 in the substrate table 136a,b, using imprint template alignment gratings provided on the imprint template 120. This improves the accuracy with which the position of the substrate table 136a,b relative to the imprint template 120 is measured (e.g. to take account of rotation of the substrate table 136a,b).

Since the positions of the substrate alignment marks are known relative to the substrate table alignment gratings 154, the position of the imprint template 120 relative to the alignment marks on the substrate is now known. The imprint template 120 may thus be used to imprint patterns onto the substrate at desired locations relative to the substrate alignment marks. The position of the substrate may be controlled in the imprint module using 'feed forward' control. For example, the substrate position at which the imprint template is aligned to a die (for example) is known, and so the substrate may be moved immediately to that position. This is faster than a conventional 'feed back' system in which the substrate position at which the imprint template is aligned to a die (for example) is not known, and has to be measured immediately prior to imprinting at that die.

Prior to imprinting a pattern onto the substrate 134a,b, droplets of imprintable medium may be provided on the substrate by an imprintable medium dispenser (not illustrated).

As mentioned further above, separating measurement of the substrate from imprinting may allow the throughput of the lithography apparatus to be increased.

The imprint template alignment marks 162 may be, for example, provided at or adjacent to each corner of the imprint template 120. The imprint template alignment marks 162 may be, for example, provided in scribe lanes of a pattern to be imprinted by the imprint template 120.

The embodiment shown in FIG. 6 may be combined with embodiments shown in other Figures. In an imprint lithography apparatus, the alignment of the imprint template relative to the substrate may be measured before each imprint onto the substrate takes place. Such an alignment measurement may compensate (at least in part) for change of the size and/or shape of the imprint template (although it may still be beneficial to measure change of the size and/or shape of the imprint template using an embodiment of the invention). If the embodiment of FIG. 6 is used, then alignment of the imprint template relative to the substrate is not measured before each imprint. Instead, alignment is measured in the measurement module 110 (and imprint module 112) of the lithography apparatus before imprinting onto the substrate is begun. Thus, change of the size and/or shape of the imprint template during the imprinting phase will not be compensated for (during alignment of the imprint template to the substrate). For this reason, it may be advantageous to use the embodiments described in relation to FIGS. 2-5 to measure change of the size and/or shape of the imprint template, and to adjust the size and/or shape of the imprint template accordingly, or to provide alignment corrections accordingly.

Referring to FIG. 6, the initial size and shape of the imprint template 120 may be taken as being the size and shape of the imprint template when the position of the substrate table 136a,b relative to the imprint template is measured. Subsequent change of the size and/or shape of the imprint template 120 may be measured using an embodiment of the invention described in relation to FIGS. 2 to 5. These changes may be taken into account when aligning the imprint template 120 and the substrate 134a,b. Additionally or alternatively, the change may be corrected (or substantially corrected) using the piezo-electric actuators 22a-d.

The change of the size and/or shape of the imprint template 120 may be measured while the imprint template is in contact with imprintable medium provided on the substrate. The change of the size and/or shape of the imprint template 120 may be measured after the imprint template has been in contact with imprintable medium provided on the substrate. The change of the size and/or shape of the imprint template 120 may be measured continuously.

The substrate table alignment gratings 154 and detector 152 may be replaced by any suitable alignment mark and detector. For example, a substrate table alignment mark may be reflective, a detector being configured to detect radiation reflected from the alignment mark. The detector may be configured to detect radiation reflected from the substrate table alignment mark and radiation reflected from an imprint template alignment mark, and thereby determine the position of the substrate table relative to the imprint template. The detector may be at or near radiation output 114 or on the side of imprint template 120 opposite to the substrate table 136a,b.

When the imprint template 120 is removed from the first substrate 134a, forces acting on the first substrate 134a may cause the first substrate 134a to be displaced on the first substrate table 136a (or deformed). For this reason, the first substrate table 136a may move from the imprint module 112 of the lithography apparatus to the measurement module 110, where the position of the first substrate 134a on the first substrate table 136a may be measured using the alignment sensor 116. At the same time, the second substrate table 136b may be moved to the imprint module 112 of the lithography apparatus, to allow a pattern to be imprinted onto the second substrate 134b. When the imprint template 120 is removed from the second substrate 134b, the substrate table 136a,b may be swapped again between the measurement module 110 and the imprint module 112, to allow the imprint template 120 to imprint again onto the first substrate 134a. This swapping of the substrate tables 136a,b between the measurement module 110 and the imprint module 112 may take place after each imprint, or after a plurality of imprints. If the swapping takes place after a plurality of imprints, the positions of the imprints on the substrate may be selected such that the displacement (or deformation) of the substrate during imprint is limited.

Two or more measurement modules 110 may be provided. A first measurement module may, for example, be used to measure the positions of substrate alignment marks, the topology of the substrate, and the positions of substrate table alignment marks. The second measurement module may be used to measure the position of the substrate on the substrate table after an imprint (or a plurality of imprints) has taken place.

As explained above, an embodiment of the invention may measure only the size of the imprint template. Where this is the case, a model which relates shape change of the imprint template to size change of the imprint template may be used to estimate a change of the shape of the imprint template when a change of the size of the imprint template occurs.

The imprint template may be held in an imprint template holder. Where this is the case, provided that change of the size and/or shape of the imprint template holder mirrors change of the size and/or shape of the imprint template, an embodiment of the invention may measure change of the size and/or shape of the imprint template holder in order to determine change of the size and/or shape of the imprint template. Embodiments of the invention may use position sensors to measure changes of the positions of portions of the imprint template perimeter via measurement of changes of the position of portions of the imprint template holder.

Described embodiments of the invention use piezo-electric actuators to modify the size and/or shape of the imprint template. However, any suitable actuators may be used. Embodiments of the invention may be used to monitor the performance of the actuators.

Cartesian coordinates have been used in the description in order to aid understanding of the invention. The Cartesian coordinates are not intended to mean that the imprint template (or other parts of the lithography apparatus) must have a particular orientation.

The present invention relates to imprint lithography apparatus and methods. The apparatus and/or methods may be used for the manufacture of devices, such as electronic devices and integrated circuits or other applications, such as the manufacture of integrated optical systems, guidance and detection patterns for magnetic domain memories, flat-panel displays, liquid-crystal displays (LCDs), thin film magnetic heads, organic light emitting diodes, etc.

In this specification, the term "substrate" is meant to include any surface layers forming part of the substrate, or being provided on another substrate, such as a planarization layer or anti-reflection coating layer.

In the above embodiments, the lithography apparatus comprises a single imprint template. In other embodiments, more than one imprint template or more than one imprint template holder may be provided in the lithography apparatus, in order for imprints to be undertaken more efficiently or quickly (e.g. in parallel). For example, in an embodiment, there is provided an apparatus that includes a plurality (e.g. 2, 3, or 4) of imprint templates or imprint template holders. The lithography apparatus may comprise a plurality (e.g. 2, 3, or 4) of imprintable medium dispensers.

While specific embodiments of the invention have been described above, it will be appreciated that the invention may be practiced otherwise than as described. For example, an embodiment of the invention may take the form of a computer program containing one or more sequences of machine-readable instructions configured to cause performance of a method as disclosed above, or a computer-readable data storage medium (e.g. semiconductor memory, magnetic or optical disk) having such a computer program stored therein.

The descriptions above are intended to be illustrative, not limiting, Thus, it will be apparent to those skilled in the art that modifications may be made to the invention as described without departing from the scope of the claims set out below.

Further embodiments of the invention are given in the following numbered clauses:

1. An imprint lithography apparatus comprising:
    an imprint template holder arranged to hold an imprint template; and
    a plurality of position sensors configured to measure change of the size and/or shape of the imprint template, wherein the position sensors are mechanically isolated from the imprint template.
2. The apparatus of clause 1, wherein the position sensors are configured to measure change of the positions of portions of the imprint template perimeter.
3. The apparatus of clause 1 or clause 2, wherein the position sensors are configured to measure positions of sets of lines, the position sensors and the sets of lines acting as linear encoders.
    The apparatus of clause 3, wherein the sets of lines are provided in the perimeter of the imprint template.
5. The apparatus of clause 3, wherein the sets of lines are provided on structures attached to the imprint template.
6. The apparatus of clause 1, wherein the position sensors are configured to measure the positions of alignment marks provided in the perimeter of the imprint template.
7. The apparatus of any preceding clause, wherein the imprint template holder comprises a plurality of actuators provided around the perimeter of the imprint template, the actuators configured to apply force to the imprint template to change the size and/or shape of the imprint template.
8. The apparatus of clause 7, wherein the position sensors and the actuators together comprise a control loop configured to control the size and/or shape of the imprint template.
9. The apparatus of clause 7 or clause 8, wherein the position sensors comprise an interferometer, the interferometer configured to direct a laser beam at a reflector which surrounds or substantially surrounds one of the plurality of actuators but is not in mechanical communication with that actuator.
10. The apparatus of clause 3 and clause 7, wherein the sets of lines are provided on the actuators.
11. The apparatus of any preceding clause, comprising:
    a measurement module configured to measure the positions of alignment marks on a substrate provided on a first substrate table; and
    an imprint module which comprises the imprint template holder, the plurality of position sensors and a second table,
    wherein the apparatus is configured to move the first substrate table to the imprint module once the positions of the substrate alignment marks have been measured, and
    the imprint module is configured to imprint a pattern onto the substrate at locations which are determined relative to the substrate alignment mark positions as measured by the measurement module.
12. The apparatus of clause 11, wherein the first substrate table is provided with alignment marks, the measurement module is configured to measure the positions of the substrate alignment marks relative to the first substrate table alignment marks, and the imprint module further comprises an alignment apparatus which is configured to measure the position of the imprint template relative to the first substrate table alignment marks.

13. The apparatus of clause 11 or clause 12, wherein the imprint module is configured to control the size and/or shape of the imprint template.

14. The apparatus of any of clauses 11 to 13, wherein the measurement module is one of a plurality of measurement modules.

15. A lithography method comprising:
  using an imprint template to imprint a pattern onto a substrate; and
  measuring changes of the size and/or shape of the imprint template while imprinting the pattern onto the substrate.

16. The lithography method of clause 15, wherein the changes of the size and/or shape of the imprint template are measured while the imprint template is in contact with imprintable medium provided on the substrate.

17. The lithography method of clause 15 or clause 16, wherein the changes of the size and/or shape of the imprint template are measured after the imprint template has been in contact with imprintable medium provided on the substrate.

18. The lithography method of any of clauses 15 to 17, further comprising using actuators to control the size and/or shape of the imprint template.

19. The lithography method of any of clauses 15 to 18, wherein the changes of the size and/or shape of the imprint template are measured using a plurality of position sensors which are mechanically isolated from the imprint template, the position sensors configured to measure changes of the positions of portions of the imprint template perimeter.

20. The lithography method of clauses 15 to 19, further comprising:
  using a measurement module to measure the positions of alignment marks on a substrate on a first substrate table;
  moving the first substrate table to an imprint module which comprises the imprint template and a second table; and
  imprinting a pattern onto the substrate at locations which are determined relative to the substrate alignment mark positions as measured by the measurement module, the changes of the size and/or shape of the imprint template being measured in the imprint module.

21. The lithography method of clause 20, wherein the measurement module measures the positions of the substrate alignment marks relative to alignment marks provided on the substrate table, and the imprint module further comprises an alignment apparatus which is configured to measure the position of the imprint template relative to the substrate table alignment marks.

22. The lithography method of clause 20 or clause 21, further comprising transferring the first substrate table from the imprint module to the measurement module after the pattern has been imprinted one or more times onto the substrate, measuring the position of the substrate relative to the substrate table, then transferring the first substrate table back to the imprint module, and then imprinting the pattern one or more times onto the substrate.

23. An imprint lithography apparatus comprising:
  a measurement module configured to measure the positions of alignment marks on a substrate provided on a first substrate table; and
  an imprint module which comprises an imprint template and a second table,
  wherein the apparatus is configured to move the first substrate table to the imprint module once the positions of the substrate alignment marks have been measured, and the imprint module is configured to imprint a pattern onto the substrate at locations which are determined relative to the substrate alignment mark positions as measured by the measurement module.

24. The apparatus of clause 23, wherein the first substrate table comprises alignment marks, the measurement module is configured to measure the positions of the substrate alignment marks relative to the substrate table alignment marks, and the imprint module further comprises an alignment apparatus configured to measure the position of the imprint template relative to the substrate table alignment marks.

The invention claimed is:

1. An imprint lithography apparatus comprising:
  an imprint template support structure configured to hold an imprint template; and
  a plurality of measurement sensors configured to measure a change of size and/or shape of the imprint template, wherein the measurement sensors are configured to measure a change of position of portions of a perimeter of the imprint template by way of reflectors extending from a side face of the imprint template distinct from an imprint pattern surface thereof, the reflectors substantially surrounding respective actuators of the support structure,
  wherein the apparatus is configured to at least cause the size and/or shape of the imprint template to be changed to conform with a size and/or shape of a pattern already present on a substrate and to imprint an imprint pattern with the imprint template onto the substrate.

2. The imprint lithography apparatus of claim 1, wherein the measurement sensors comprise a plurality of position sensors configured to measure the change of size and/or shape of the imprint template, the plurality of position sensors mechanically isolated from the imprint template.

3. The imprint lithography apparatus of claim 1, further comprising:
  an imprint module comprising the imprint support structure, wherein the change of the size and/or shape of the imprint template is measured in the imprint module;
  a measurement detector configured to measure at least the positions of alignment marks on the substrate on a first substrate table; and
  a second table;
  wherein the apparatus is configured to cause movement of the second table away from the imprint module, cause movement of the first substrate table from the measurement detector to the imprint module, and cause imprinting of the imprint pattern onto the substrate at locations which are determined relative to the substrate alignment mark positions as measured by the measurement detector.

4. The imprint lithography apparatus of claim 3, wherein the measurement detector is configured to measure the positions of the substrate alignment marks relative to alignment marks provided on the first substrate table, and the imprint module further comprises an alignment apparatus configured to measure the position of the imprint template relative to the substrate table alignment marks.

5. The imprint lithography apparatus of claim 3, wherein the apparatus is further configured to cause movement of the first substrate table from the imprint module to the measurement detector after the imprint pattern has been imprinted one or more times onto the substrate, cause measurement of the substrate relative to the first substrate table at the measurement detector, then cause movement of the first substrate table back to the imprint module, and then cause imprinting of the imprint pattern one or more times onto the substrate.

6. The imprint lithography apparatus of claim 1, wherein the measurement sensors are configured to measure the change of the size and/or shape of the imprint template while the imprint template is in contact with imprintable medium provided on the substrate.

7. The imprint lithography apparatus of claim 1, wherein the respective actuators are configured to control the size and/or shape of the imprint template responsive to a change of size and/or shape of the imprint template measured by the measurement sensors.

8. The imprint lithography apparatus of claim 1, wherein the imprint template comprises a protrusion having a bottom surface, the bottom surface of the protrusion having the imprint pattern, and wherein the measurement sensors measure at locations on the imprint template that are located outward in a horizontal direction extending parallel to the bottom surface, and also spaced apart, from a peripheral boundary of the bottom surface of the protrusion.

9. The imprint lithography apparatus of claim 1, wherein the reflectors each comprise a mounting portion and a reflecting portion, the mounting portion extending outwardly from the side face of the imprint template, and the reflecting portion being substantially parallel to the side face of the imprint template, and wherein the reflecting portion is provided with an opening through which its respective actuator extends.

* * * * *